US007956715B2

(12) United States Patent
Widjaja et al.

(10) Patent No.: US 7,956,715 B2
(45) Date of Patent: Jun. 7, 2011

(54) THIN FILM STRUCTURES WITH NEGATIVE INDUCTANCE AND METHODS FOR FABRICATING INDUCTORS COMPRISING THE SAME

(75) Inventors: Agus Widjaja, Fargo, ND (US); Andrew Sarangan, Springboro, OH (US)

(73) Assignee: University of Dayton, Dayton, OH (US)

( * ) Notice: Subject to any disclaimer, the term of this patent is extended or adjusted under 35 U.S.C. 154(b) by 13 days.

(21) Appl. No.: 12/427,296

(22) Filed: Apr. 21, 2009

(65) Prior Publication Data

US 2009/0261936 A1 Oct. 22, 2009

Related U.S. Application Data

(60) Provisional application No. 61/046,494, filed on Apr. 21, 2008.

(51) Int. Cl.
*H01F 5/00* (2006.01)
*H01F 27/02* (2006.01)
*H01F 27/28* (2006.01)
*H01L 27/08* (2006.01)

(52) U.S. Cl. ........... 336/200; 336/83; 336/232; 257/531

(58) Field of Classification Search .................... 336/83, 336/200, 232; 257/531
See application file for complete search history.

(56) References Cited

U.S. PATENT DOCUMENTS

| | | | | |
|---|---|---|---|---|
| 6,414,564 | B1 * | 7/2002 | Mizoguchi et al. | 333/35 |
| 6,573,818 | B1 * | 6/2003 | Klemmer et al. | 336/83 |
| 7,113,389 | B2 * | 9/2006 | Ishifune et al. | 361/306.3 |
| 7,126,451 | B2 * | 10/2006 | Maruyama | 336/200 |
| 2004/0103522 | A1 * | 6/2004 | Ahn et al. | 29/602.1 |
| 2005/0024176 | A1 * | 2/2005 | Wang et al. | 336/200 |
| 2006/0152325 | A1 * | 7/2006 | Nakao et al. | 336/223 |
| 2006/0158302 | A1 * | 7/2006 | Jeong et al. | 336/232 |
| 2007/0018741 | A1 * | 1/2007 | Gabara | 331/177 V |
| 2007/0070569 | A1 * | 3/2007 | Chida et al. | 361/118 |
| 2007/0126543 | A1 * | 6/2007 | Yeh et al. | 336/200 |
| 2008/0174398 | A1 | 7/2008 | Hsu et al. | |

* cited by examiner

*Primary Examiner* — Elvin G Enad
*Assistant Examiner* — Tszfung Chan
(74) *Attorney, Agent, or Firm* — Dinsmore & Shohl LLP

(57) ABSTRACT

An inductor structure comprising a substrate and a planar conductor structure on a surface of the substrate, and methods for fabricating an inductor structure. The planar conductor structure may comprise a vertical stack of three or more multilayer films. Each multilayer film may comprise a first layer of a first metal, defining a first vertical thickness, and a second layer of a second metal, defining a second vertical thickness. The metals and thicknesses are chosen such that the inductor exhibits a negative electrical self-inductance when an electrical signal is transmitted from a first contact point to a second contact point.

5 Claims, 7 Drawing Sheets

THIN FILM STRUCTURES WITH NEGATIVE INDUCTANCE AND METHODS FOR FABRICATING INDUCTORS COMPRISING THE SAME

CROSS-REFERENCE TO RELATED APPLICATIONS

This application claims the benefit of the filing date of U.S. Provisional Application Ser. No. 61/046,494, filed Apr. 21, 2008.

FIELD OF THE INVENTION

The present invention relates generally to passive electronic devices, in particular to thin film structures having negative self-inductance, and to methods for fabricating single, passive components that exhibit negative self-inductance.

BACKGROUND OF THE INVENTION

High-speed integrated circuits and semiconductor devices are known to suffer from parasitic inductances that occur, for example, in individual components and around interconnection lines. Inductance is defined generally as the ratio of magnetic flux to electric current. It is well known that when an electrical signal is passed through a conductor, for example, when a variable or periodically alternating current is passed through a wire, a magnetic field is produced around the conductor. The magnetic field varies with respect to time in the same manner as the current through that conductor. This time-varying magnetic field is capable of adversely affecting the voltage stability in that component through self-inductance, or in other nearby components through mutual inductance. Though mutual inductance effects can be obviated, for example, by shielding of some kind, elimination of self-inductance, in particular parasitic self-inductance, remains a challenge. Hereinafter, unless otherwise noted, all mentions of inductance phenomena shall refer to self-inductance, not mutual inductance.

Parasitic inductance refers to a phenomenon, whereby the magnetic fields generated by component conductors induce undesirable electronic effects. The occurrence of parasitic inductance acts as a serious performance-limiting factor to integrated circuits and semiconductor devices. For example, parasitic inductance can degrade signal quality, cause circuit noise and signal ringing, induce voltage drops (Ldi/dt) in the components, and result in loss of data.

Parasitic inductances affect the high-speed performance of circuits by influencing the impedance of components in the circuit. If the impedance of a component were to be viewed as a standing wave with a period fixed by the period of the alternating current, it would be apparent that a separate impedance wave could be constructed, 180° out-of-phase with the wave generated by the parasitic inductance, that effectively would cancel out the parasitic inductance. A fitting nomenclature for a device capable of producing such a wave, therefore, is a "negative inductor." Because they produce a negative self-inductance, the negative inductors can be used to effectively reduce or eliminate parasitic inductances, for example, in the data paths of large-scale integrated circuits. Elimination of the parasitic inductances is desirable, for example, for ensuring signal integrity in the circuits.

In macro-scale electronic devices and circuits, techniques have long been available for generating negative self-inductance "effects" by employing various complex arrangements of active components. Such arrangements may comprise multiple components, including field effect transistors (FETs), or complex integrated circuits such as operational amplifiers (op-amps), all of which require a large amount of space on a microelectronic chip. However, the necessarily high total number of components in such a negative self-inductance circuit is undesirable in the production of increasingly smaller microelectronic devices and circuits.

Therefore, there remains a need for single, passive components that produce negative self-inductance during their operation. Single-component negative inductors advantageously can reduce costs, eliminate device complexity, and save space on a microelectronic chip. Accordingly, there remains also a need for a method to fabricate components that have negative self-inductance during operation.

SUMMARY OF THE INVENTION

These needs are met by embodiments of the present invention, wherein thin film structures and methods for their fabrication are provided. When incorporated into single-component passive devices, the thin film structures exhibit a negative self-inductance that is useful, for example, to cancel out parasitic inductances in the circuit.

According to embodiments of the present invention, an inductor is provided. The inductor comprises a substrate and a planar conductor structure on the surface of the substrate. The planar conductor structure comprises a vertical stack of three or more multilayer films. Each multilayer film comprises at least two metal layers. In a given multilayer film, each metal layer defines a composition different from the other layer or layers. For example, a multilayer may comprise a first layer of metal A and a second layer of metal B. Within a single planar conductor structure, corresponding first, second, and subsequent layers of all multilayers define the same compositions, such that the vertical stack may comprise a repeating structure of multilayers. For example, a vertical stack of two-layer multilayers could be represented by the structure $(AB)_n$, where n is greater than or equal to three. The thicknesses of the metal layers are chosen such that a first and second layer of a first multilayer would have substantially the same thickness ratio to that of a first and second layer of a second multilayer formed over the first multilayer. The planar conductor further comprises two contacts. The metals used as layers in the multilayers, as well as the thicknesses of the layers, are chosen such that the inductor exhibits a negative electrical self-inductance when an electric signal is transmitted from the first contact to the second contact.

According to further embodiments of the present invention, a method for forming inductors comprising a negative-inductance thin film structure is provided. The method comprises use of a substrate coated with a lift-off resist layer. A photoresist is deposited on top of the lift-off resist and is exposed to ultraviolet light under an inductor pattern. The photoresist and the lift-off resist then are developed, during which time the lift-off resist develops isotropically to create a bi-layer reentrant sidewall profile. Thereupon, a predetermined number of multilayers are deposited sequentially onto the lift-off resist by alternating depositions of layers of chosen metals. When the lift-off resist is removed, a patterned, negative-inductance thin-film structure is left behind.

According to still further embodiments of the present invention, a microelectronic device is provided that contains at least one inductor comprising a thin film structure exhibiting negative self-inductance. The microelectronic device may comprise an integrated circuit having additional components, the operation of which generates parasitic inductance that may be canceled or compensated by the negative inductor.

DETAILED DESCRIPTION

Features and advantages of the invention now will be described with occasional reference to specific embodiments. However, the invention may be embodied in different forms and should not be construed as limited to the embodiments set forth herein. Rather, these embodiments are provided so that this disclosure will be thorough and complete and will fully convey the scope of the invention to those skilled in the art.

Figure 1:
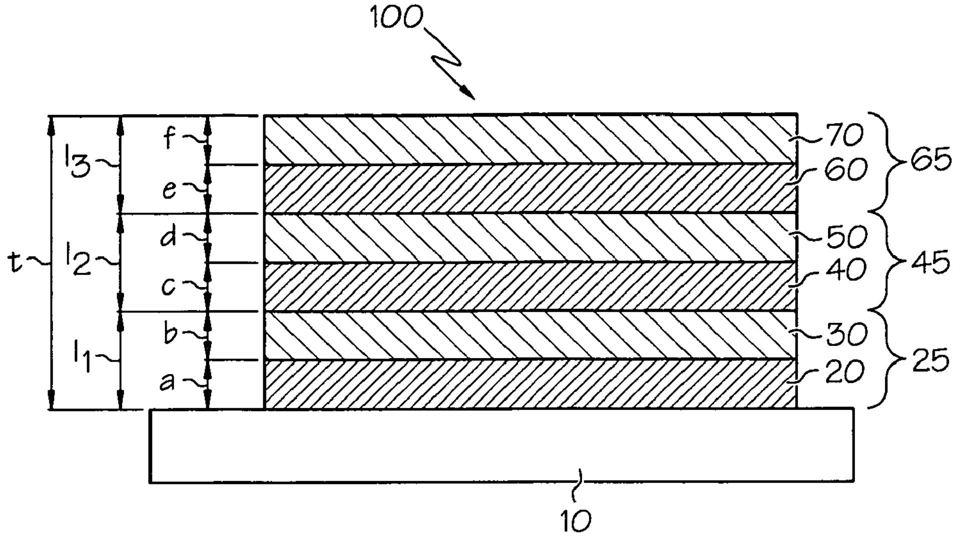
FIG. 1 depicts a cross-sectional view of the layer structure of an inductor according to embodiments of the present invention. The inductor comprises a vertical stack of three multilayers, each of which has two metal layers.

Embodiments of the present invention relate to an inductor. Referring to FIG. 1, an inductor according to embodiments of the present invention comprises a substrate 10 and a planar conductor structure 100 on a surface of the substrate 10. The planar conductor structure defines a total thickness t and comprises a vertical stack of at least one, alternatively at least three, alternatively at least five, alternatively at least ten multilayer films. Three multilayers (25, 45, and 65) are depicted in FIG. 1, but it will be understood that the number of multilayers is not limited to three. Multilayers 25, 45, and 65 have thicknesses $l_1$, $l_2$, and $l_3$ respectively. Each multilayer of the vertical stack comprises a first layer (20, 40, and 60) of a first metal and a second layer (30, 50, and 70) of a second metal different from the first metal. Thicknesses of individual metal layers are shown in FIG. 1 as a, b, c, d, e, and f. Typically, the vertical stack comprises from 5 to 50 multilayers, alternatively 10 to 50 multilayers, alternatively 20 to 50 multilayers, alternatively 20 to 30 multilayers.

Figure 2:
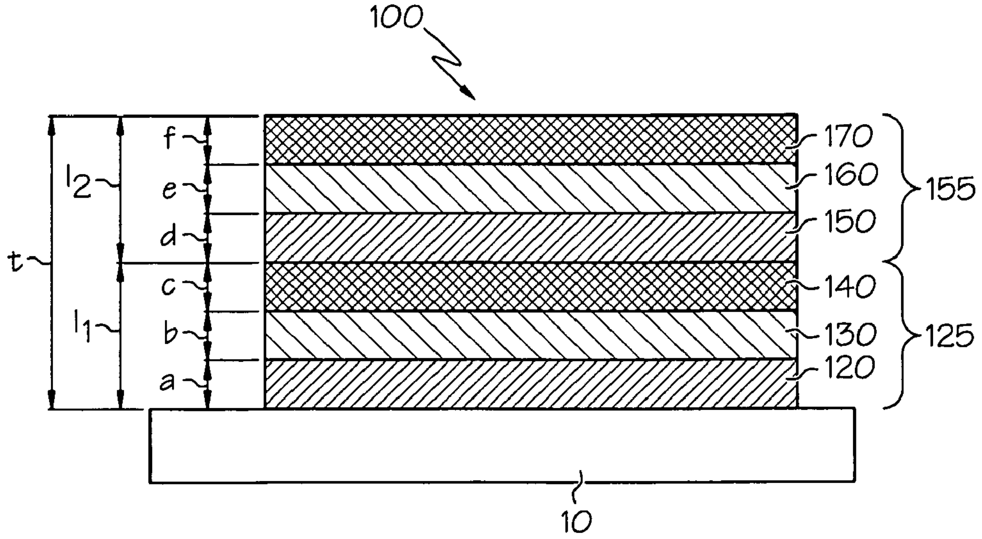
FIG. 2 depicts a cross-sectional view of the layer structure of an inductor according to embodiments of the present invention. The inductor comprises a vertical stack of two multilayers, each of which has three metal layers.

In further embodiments as depicted in FIG. 2, each multilayer 125 and 155 may comprise a first layer 120 and 150 of a first metal, a second layer 130 and 160 of a second metal different from the first metal, and a third layer 140 and 170 of a third metal different from the first and second metals. For clarity and without intent to limit the embodiments, only two multilayers are depicted in FIG. 2. Typically, the vertical stack comprises from 5 to 50 multilayers, alternatively 10 to 50 multilayers, alternatively 20 to 50 multilayers, alternatively 20 to 30 multilayers.

The substrate 10 may comprise any material having a surface amenable to growth of metal films thereon or, alternatively, having a surface amenable to growth of buffer layers onto which a metal film may be deposited. Exemplary substrates include, but are not limited to, semiconductor wafers such as silicon or gallium nitride; crystalline substrates such as lanthanum aluminate ($LaAlO_3$) or strontium titanate ($SrTiO_3$); oxides such as ceria ($CeO_2$) or alumina ($Al_2O_3$); nitrides; glasses; ceramics; quartz; or polymers. Optionally, substrates such as silicon wafers may comprise a natural or deposited oxide layer such as $SiO_2$ to provide electrical isolation of the inductor.

The thickness of the first layer of each multilayer is preselected and may vary slightly from multilayer to multilayer in a single vertical stack. Referring again to FIG. 1, the first-layer thicknesses are represented by a, c, and e. In some embodiments, no first layer in a given multilayer of a vertical stack is greater than 50% thicker than the thinnest first layer of any multilayer in the same vertical stack. In other embodiments, the thickness of each first layer is substantially the same in each multilayer. Thus, in FIG. 1, such embodiments would imply $a \approx c \approx e$. As used herein, "substantially the same" with respect to a measurement of length accounts for deviations inherent in the use of repetitive growth techniques, described below in detail, and specifically foresees within the scope of these embodiments variations of up to ±10%, alternatively up to ±5%, alternatively up to ±1%.

Additional layers of the multilayers have thicknesses defined according to a preselected multiple of the thickness of the first layer. The multiple typically is in the range of, for example, 0.05 to 20, alternatively 0.1 to 10, alternatively 0.16 to 6, alternatively 0.33 to 3. In all multilayers of the vertical stack, the ratio of the thickness of the first layer to the thickness of the second layer is substantially the same. Thus, referring again to FIG. 1, in all embodiments $a/b \approx c/d \approx e/f$. If three layers are present in the multilayer as shown in FIG. 2, additionally the ratio of the thickness of the second layer to the thickness of the third layer is substantially the same in each multilayer of the vertical stack. Thus, in FIG. 2, $a/b \approx d/e$ and $b/c \approx e/f$.

For embodiments wherein the thickness of the first layer is substantially the same in each multilayer, it follows that the thicknesses of the second and subsequent layers will be substantially the same as those of their respective counterparts in each multilayer also. Thus, for two-layer multilayers as in FIG. 1, if $a \approx c \approx e$, then $b \approx d \approx f$. For the three-layer multilayers of FIG. 2, if $a \approx d$, then $b \approx e$ and $c \approx f$.

Typically, the planar conductor 100 has a total thickness t of 0.1 μm (1000 Å) to 5 μm (50,000 Å). In one embodiment, the total thickness t is about 1.0 μm (10,000 Å). The range of thicknesses for individual layers within multilayers of the vertical stack depends on the desired number of multilayers in the stack and on the desired thickness ratio between the first, the second, and, the optional third layers of the multilayer. In an exemplary embodiment not intended to be limiting, the vertical stack may be 1.0 μm (10,000 Å) thick and be composed of ten multilayers, each comprising aluminum first layers and copper second layers, wherein the ratio of the thickness of each first layer to the thickness of each second layers is preselected to equal two. Thus, if all aluminum layers were chosen to have substantially the same thickness, each aluminum layer would be 667 Å thick, each copper layer would be 333 Å thick, and each of the ten multilayers would be 1000 Å thick.

With respect to composition, the metal layers of the multilayers may be selected from any electrically conductive metal or alloy of two or more metals, all of which being compatible with electronic devices. In one embodiment, the metals may be selected from silver, gold, nickel, aluminum, copper, or alloys of any of these. In another embodiment, the metal may be selected from aluminum, copper, or alloys of aluminum and copper. In yet another embodiment, the metal layers each consist essentially of a single metal, for example, aluminum or copper. It will be understood that any of the metal layers may comprise one or more impurities in minute or residual amounts not exceeding, for example, 5% total by weight, with no more than 1% by weight coming from any single impurity.

In all multilayers, the composition of the first, second, and optional third metal layers all are unique within a single multilayer, so as to result in an interface of dissimilar metals between each layer of each multilayer and also between the top layer of a first multilayer and the first layer of a second multilayer covering the first multilayer. Thus, the composition of the first metal layer is not equal to the composition of the second metal layer, and the composition of an optional third metal layer is not equal to the composition of either the first or second metal layer. From multilayer to multilayer, however, all first metal layers define compositions that are substantially the same, all second metal layers define compositions that are substantially the same, and all third metal layers define compositions that are substantially the same. With respect to metal layer compositions, the term "substantially the same" means the same base metal or alloy compose each layer, but compositional variations of less than 5% by weight of the layer are foreseeable with respect to the minor impurities described above.

Thus, the vertical stack of the inductors according to embodiments of the present invention comprise three or more multilayers such that, with respect to metal composition, as defined above, the entire structure of the stack can be represented as a repeating series of alternating layers. For example, if two metal layers are present, the structure is essentially $(AB)_n$, where A represents a first metal, B represents a second metal, and n is an integer greater than or equal to three representing the number of multilayers. If three metal layers are present, the structure is essentially $(ABC)_n$, where A represents a first metal, B represents a second metal, C represents a third metal, and n is an integer greater than or equal to three representing the number of multilayers.

Figure 3A:
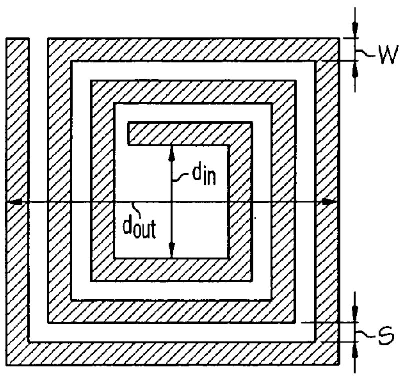
FIG. 3 are exemplary spiral shapes of inductors according to embodiments of the present invention.
Figure 3B:
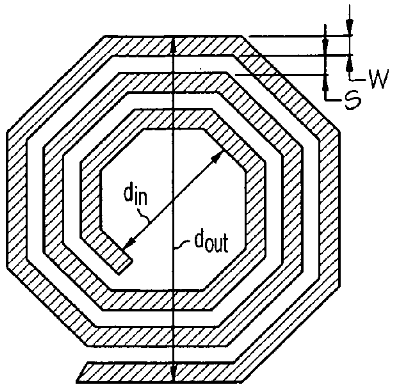
Figure 3C:
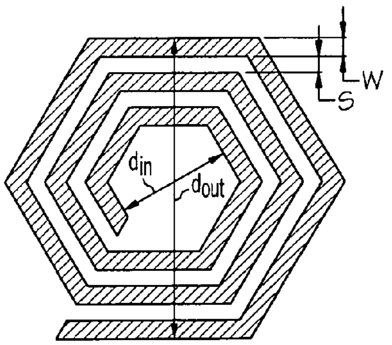
Figure 3D:
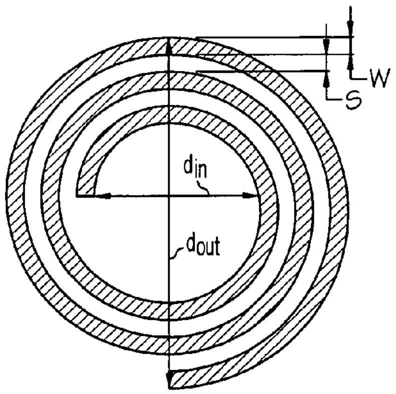
Figure 4A:
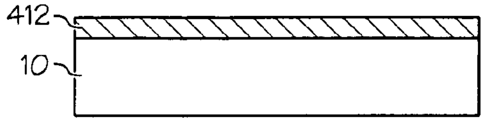
FIG. 4 illustrates the use of a lift-off resist in methods for fabricating inductors according to embodiments of the present invention.
Figure 4D:
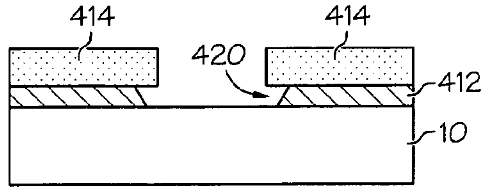
Figure 4B:
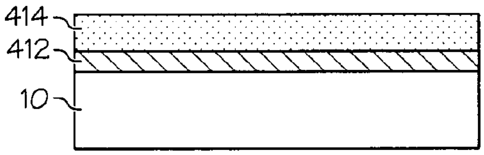
Figure 4E:
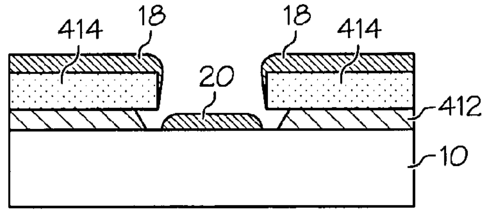
Figure 4C:
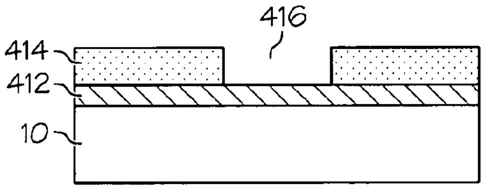
Figure 4F:
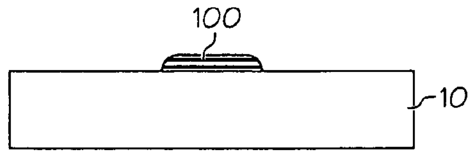
Figure 5A:
FIG. 5 illustrates an exemplary method for fabricating inductors according to embodiments of the present invention.
Figure 5B:
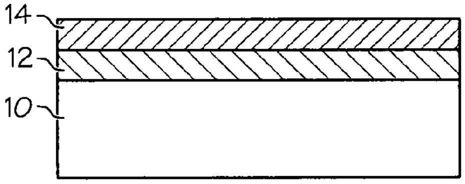
Figure 5C:
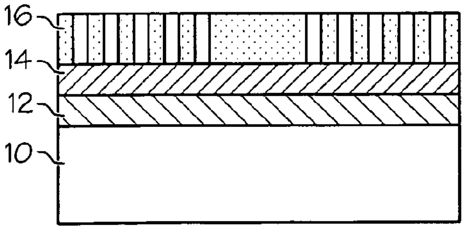
Figure 5D:
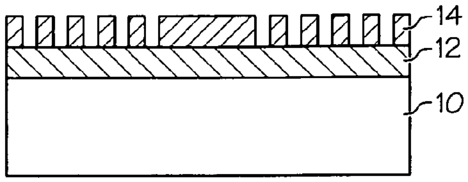
Figure 5E:
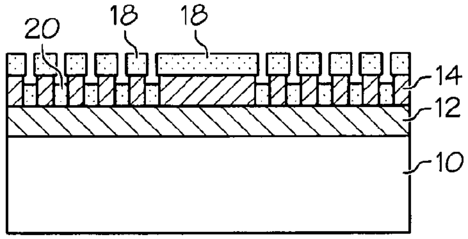
Figure 5F:
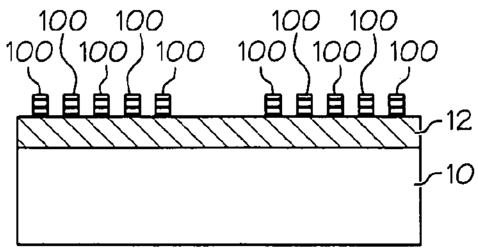

An inductor according to embodiments of the present invention may define a shape such as a straight line or a series of successive spirals. Exemplary spiral shapes are depicted in FIG. 3. FIG. 3A shows a square; FIG. 3B shows an octagon; FIG. 3C shows a hexagon, and FIG. 3D shows a circle. Further exemplary shapes include, but are not limited to, triangles; non-square rectangles; polygons with greater than four sides, such as decagons; and ellipses. As shown in FIG. 3, the spirals define a number of turns, a track width w, a spacing s, an inner radius $d_{in}$, and an outer radius $d_{out}$. Each spiral in FIG. 3 has three turns, based on the number of times the measurement line for $d_{out}$ crosses a conductor track, divided by two.

An electrical signal may be passed through the inductor from a first contact point to a second contact point. As used herein, "contact point" refers to a location where electrical continuity can be established between the planar conductor of the inductor and, for example, a power source, other device components, or an external circuit. The contact points may be selected based on the geometry of the inductor. If the inductor is a straight line, for example, the two contact points may be at both ends. If the inductor is a spiral, for example, the first contact point may be chosen as the outer terminus of the spiral and the second contact may be chosen as the center terminus of the spiral. Either contact point may be chosen, for example, to be on a top surface of the planar conductor. Electrical connection of the inductor to external components may be established through the first and second contact points by any means common in the art for forming electric contacts or bonding wires such as, for example, soldering. Thereby, advantages such as negative self-inductance may be realized from the inductor when an electrical signal such as an alternating current is passed through the inductor from the first contact point to the second contact point or from the second contact point to the first contact point.

The first, second, and optional third layers in the multilayer, as well as the thicknesses of each layer, are chosen so that when an electrical signal is passed between the two contacts of the inductor, the inductor produces a negative electrical self-inductance. The electrical signal may comprise an alternating current. In one embodiment, the alternating current may have a frequency of up to 10 MHz. However, it is foreseeable in the scope of these embodiments that choice of metal layers, layer thicknesses, and number of layers can be made so as to provide inductors with negative self-inductance even when the current is at much higher frequencies, for example, 100 MHz, 1 GHz, 10 GHz, and higher. If the inductor according to embodiments of the present invention is incorporated in to a circuit comprising additional components, the negative electrical self-inductance generated by the inductor may be beneficial, for example, to cancel out effects of parasitic "positive" inductances produced by the other components.

Further embodiments of the present invention relate to methods for fabricating thin-film inductors that exhibit negative self-inductance.

A complete illustration of a lift-off photolithography technique, applicable to embodiments of the present invention, is provided in FIG. 4. Beginning with FIG. 4A, substrate 10 is coated with lift-off resist 412. As shown in FIG. 4B, the lift-off resist 412, is baked, coated with photoresist 414, and baked again. As shown in FIG. 4C, photoresist 414 is exposed to ultraviolet light through a mask to result in cured regions such as 416, which are removed in the developing process. As shown in FIG. 4D, when the photoresist is developed, however, isotropic etching of the lift-off resist 412 results in a reentrant sidewall profile 420 and leaves a void underneath a portion of the photoresist 414. As shown in FIG. 4E, a first metal layer is deposited. A portion of the metal layer 20 deposits on the exposed substrate 10, and a portion 18 deposits on remaining photoresist 414. The reentrant sidewall profile formed in step (d) prevents the metal layer 20 on the substrate from sticking to any of the lift-off resist 412, the photoresist 414, and the metal layer 18 growing on the photoresist 414. Multiple metal layers are deposited in the alternating scheme described in detail below. As shown in FIG. 4F, after all depositions are completed, the photoresists are removed to leave behind a clean stack of multilayers 100 that form the planar conductor of the inductor.

In one embodiment of a method for forming inductors, the method comprises first providing a substrate. Optionally, the substrate may be oxidized or coated with an oxide layer such as $SiO_2$ to provide electrical isolation between the inductor and the substrate. The lift-off photolithographic method described above is then used to form a planar conductor structure. In particular, the substrate is coated with a layer of lift-off resist. An example lift-off resist is LOR 10B (available from Microchem). The lift-off resist may be applied by any suitable means, according to the product specifications. The LOR 10B, for example, may be applied by spin coating at about 2000 rpm to obtain a thickness of approximately 12,500 Å. Under any circumstances, the thickness of the lift-off resist must exceed the intended thickness of the vertical stack of the inductor being fabricated. Otherwise, the vertical stack can stick to metal on the photoresist and detach when the photoresist is removed.

After the lift-off resist is applied, the coated substrate is soft-baked, for example, at about 180° C. Then, the lift-off resist is coated with a layer of photoresist. Any number of photoresists known in the art may be used. One exemplary photoresist is SPR™955 (available from Rohm and Haas), a positive-type photoresist. For example, the SPR™955 may be spin-coated at about 3000 rpm to obtain a thickness of approximately 10,000 Å. After the photoresist is applied, the substrate is again soft-baked, for example, at about 100° C. for about 90 seconds.

The substrate, now coated with lift-off resist and photoresist, is exposed to an appropriate curing medium, such as ultraviolet light, to transfer the inductor pattern onto the photoresist. The photoresist then is developed in an appropriate developer such as MF-319 (available from Rohm and Haas) for about 1 minute. When the undeveloped resists are removed in preparation for metal deposition, an undercut forms between the photoresist layer and the substrate, owing to the isotropic etching behavior of the lift-off resist. This undercut permits in a subsequent step the clean removal of metal that is not part of the inductor pattern.

Metal layers then are deposited onto the photoresist layers to form a vertical stack of multilayer films. Deposition may be accomplished by any method known in the art for depositing thin layers of metal, for example, electroplating, inductive evaporation, electron beam evaporation, chemical vapor deposition, sputtering, pulsed laser deposition, or combinations thereof. In exemplary embodiments, metal layers are deposited by radio-frequency plasma sputtering.

The vertical stack according to the method of embodiments of the invention may comprise three or more multilayers, each multilayer comprising at least two layers of metal. Thus, to form a first multilayer, initially a first metal layer is deposited to a first predetermined thickness. The thickness may be assessed during deposition by means known in the art including, but not limited to, using in-situ evaluation techniques or fixing deposition times based on a calibration curve of expected thickness versus deposition time. After the first metal layer grows to the first predetermined thickness, the second metal layer is deposited on the first layer until the second metal layer reaches a second predetermined thickness. The second predetermined thickness is selected in terms of its ratio to the thickness of the first layer. For example, if the thickness of the first layer is preselected as 1000 Å and the ratio of the thickness of the first layer to that of the second layer is preselected as 2.5, the second layer will be grown to a thickness of 400 Å. If a third metal layer is to be deposited on the second metal layer, the third layer is grown to a thickness predetermined as a ratio with respect to the thickness of the second metal layer.

Subsequent multilayers are deposited by repeating the method for depositing the first multilayer. Thus, formation of the vertical stack as a whole comprises a repetitive series of alternating depositions of two or three metal layers. Repeating the deposition process N times thereby results in a vertical stack of N+1 multilayers. In one embodiment, the deposition process is repeated at least 9 times to form at least 10 multilayers. In another embodiment, the deposition process is repeated at least 29 times to form at least 30 multilayers. In still another embodiment, the deposition is repeated 2 to 49 times to form 3 to 50 multilayers.

After the desired number of multilayers has been reached by the repetitive series of alternating depositions, the photoresists are removed to complete the lift-off process. The entire substrate may be placed, for example, in a solution containing an Edge Bead Remover (EBR) solvent such as those available from MicroChem. The EBR solvents are strong solvents that commonly are used to remove edge beads that build up on the edge of silicon wafers during spin coating processes. The solvents effectively remove all photoresist material; however, a cleaning with acetone, methanol, isopropanol, or other solvents may be desirable. Owing to the undercut structure in the layer of lift-off resist, all metal that was deposited on the lift-off resist washes off into the photoresist removal solvent, leaving behind the inductor structure comprising one or more multilayers.

The foregoing steps related to patterning the inductors are depicted in FIG. 5 as an exemplary embodiment, wherein step (a) comprises providing a silicon substrate 10. In step (b), the silicon substrate 10 is coated with a layer of $SiO_2$ 12 and photoresists 14. In step (c), the photomask 16 is placed over photoresists 14, which are exposed to ultraviolet light through slits in the photomask 16. In step (d), the photoresists 14 are developed, and uncured photoresist is washed away. In step (e), metal layers are applied. Some metal layers 20 deposit directly on the $SiO_2$ layer 12, while other metal layers 18 deposit on photoresist 14. In step (f), the photoresists are removed to leave behind conductor tracks 100 comprising multiple multilayers, depicted in FIG. 5 as a cross-section of an inductor spiral.

Thereupon, contacts may be bonded to at least two points on the inductor by any means known in the art for bonding wires or conductors to metal layers, for example, by soldering.

Further embodiments of the present invention relate to microelectronic devices comprising at least one inductor according to embodiments of the present invention.

The microelectronic devices may comprise, for example, integrated circuits. A truly negative inductor according to embodiments of the present invention can replace complicated electronic component arrangements in such integrated circuits, which previously have been capable only of synthesizing or simulating negative inductance behavior. This results in reduced costs, eliminated complexity, and saved space on circuit boards. Furthermore, inductors according to embodiments of the present invention may be used in high-speed, digital, very-large-scale integrated-circuit design, (VLSI) for which parasitic inductances are known to diminish signal integrity.

Though the inductors according to embodiments of the invention are of particular utility for inductance compensation in electronic circuits that are subject to undesirable inductances, the inductors also may be applied to optoelectronics and to voltage regulation. For example, the inductors may be used to prevent voltage drops after a load demand increment. The inductors may be used as a displacement-factor correction to achieve a maximum power factor. For example, inductive load causes displacement between voltage and current, degrading the power factor and reducing efficiency. Negative inductance compensates the inductive load, bringing voltage and current back in phase.

The inductors also may be used in the compensation of transmission lines, for example, to adjust the phase mismatch between two transmission lines. The inductors may be used in antenna band-width enhancement, whereby negative inductance can broaden the bandwidth of a microstrip antenna.

EXAMPLES

The present invention will be better understood by reference to the following examples, which are offered by way of illustration and which one of skill in the art will recognize are not meant to be limiting.

In the following examples, circle-shaped spiral inductors were fabricated by a lift-off photolithography method according to embodiments of the present invention and described above. Each exemplary inductor had ten turns, a track width of about 100 μm, a spacing of about 100 μm, and an inner radius of about 200 μm.

Inductance values for the inductors were determined using an HP85046A S-Parameter Test Set and HP8753C Network Analyzer were used. Full 2-port measurements were taken, and the results were in scattering parameters (S-parameters). S-parameters are characteristics describing the electrical behavior of an electrical network with small signal input. The scattering relates to the manner in which the traveling currents and voltages in a transmission line are affected when they meet an impedance that is different from the impedance of the line. The coefficients in S-parameters are $S_{11}$ (input reflection coefficient), $S_{21}$ (forward transmission coefficient), $S_{12}$ (reverse transmission coefficient), and $S_{22}$ (output reflection coefficient).

The S-parameters were converted to inductance values using Equations 1-3 below:

$$\Delta_S=(1+S_{11})(1+S_{22})-S_{12}S_{21} \quad (1)$$

$$Y_{21}=-2S_{21}/\Delta_S \quad (2)$$

$$\text{Inductance}=-im/[Y_{21}(2\pi f)] \quad (3)$$

Example 1

To examine negative inductance behavior with respect to variation of layer thickness within multilayers, three exemplary inductors were fabricated. The planar conductor structures of the inductors comprised ten multilayers formed by radio-frequency plasma sputtering. Each multilayer comprised a first layer of aluminum and a second layer of copper. The total thickness of the planar conductor structure was approximately 1.0 μm; thus, each multilayer was about 0.1 μm (1000 Å) thick. Each inductor fabricated in this example will be described by the notation $A_xB_y$, wherein A is the first metal, B is the second metal, and x and y are thicknesses of the metal layers in each multilayer, normalized to 100. The subscript notation is otherwise unrelated to chemical composition.

Thus, a first inductor $Al_{34}Cu_{66}$ was fabricated with all 333 Å thick aluminum layers and 667 Å thick copper layers, for an Al:Cu thickness ratio of 0.5. A second inductor $Al_{50}Cu_{50}$ was fabricated with all 500 Å thick aluminum layers and 500 Å thick copper layers, for an Al:Cu thickness ratio of 1.0. A third inductor $Al_{66}Cu_{34}$ was fabricated with all 667 Å thick aluminum layers and 333 Å thick copper layers, for an Al:Cu thickness ratio of 2.0.

Figure 6:
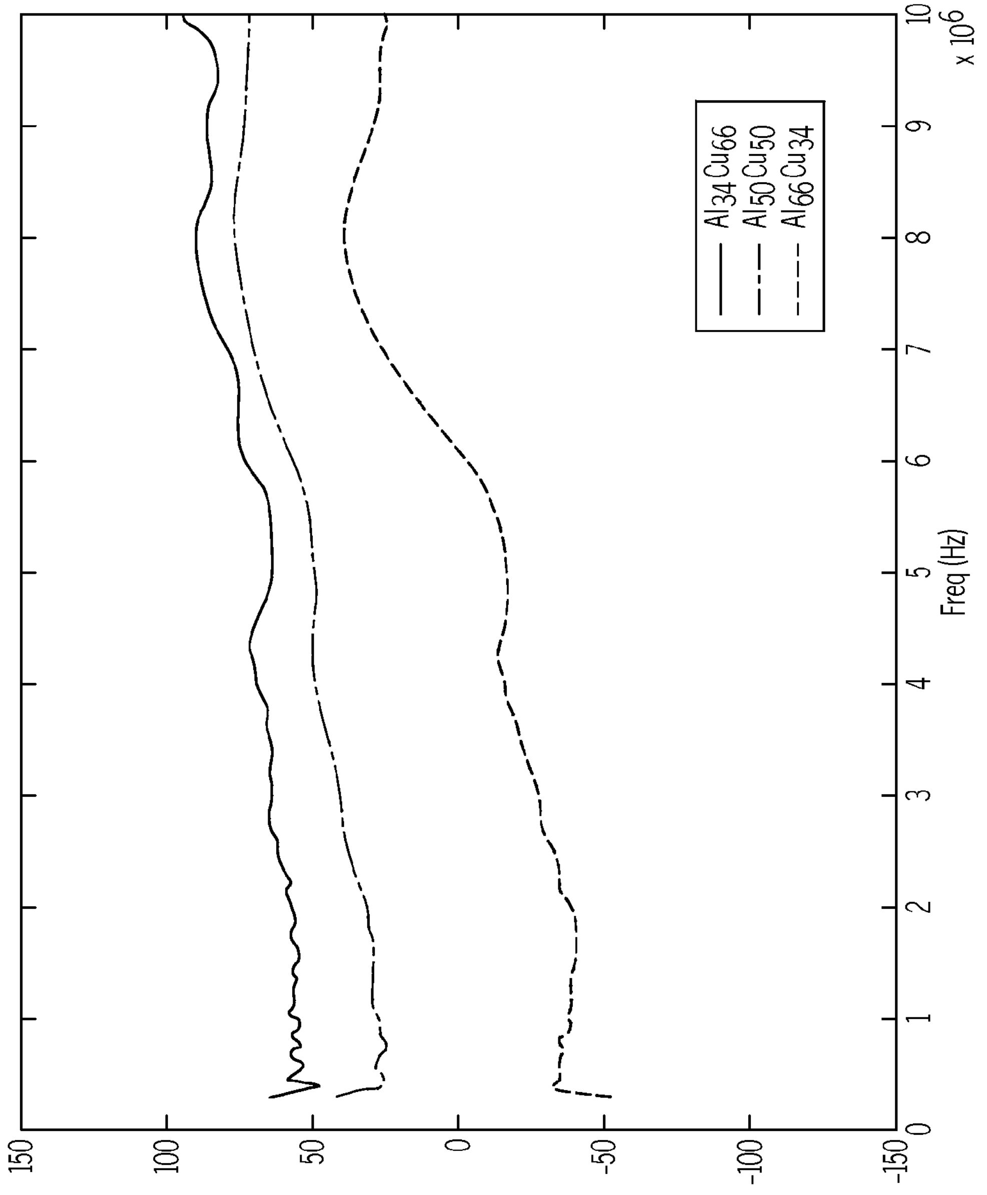
FIG. 6 is a graph depicting the extent of negative self-inductance exhibited at frequencies up to 10 MHz by a 10-turn circle spiral inductor with one multilayer as a function of various thicknesses of aluminum first layers and copper second layers.

The inductance of these inductors with respect to frequency was calculated using the conversion from S-parameters, as described above. The results are compiled in FIG. 6. Of the three inductors, only the $Al_{66}Cu_{34}$ inductor exhibited substantial negative inductance below about 6 MHz. This illustrates the importance of the selection of layer thickness within the multilayers of inductors according to embodiments of the present invention.

Example 2

Additional 10-turn circle inductors were fabricated that showed exceptional negative inductance characteristics below 10 MHz. Each inductor was fabricated with 10 multilayers and planar conductor structure total thickness of 1.0 μm. Described using the thickness notation from Example 1 above, the following thickness ratios resulted in inductors with negative inductance at most frequencies below 10 MHz: $Al_{66}Ni_{34}$, $Al_{34}Ni_{66}$, $Cu_{66}Ni_{34}$, $Cu_{34}Ni_{66}$, $Al_{66}Ag_{34}$, and $Al_{16}Ni_{68}Cu_{16}$.

Example 3

Figure 7:
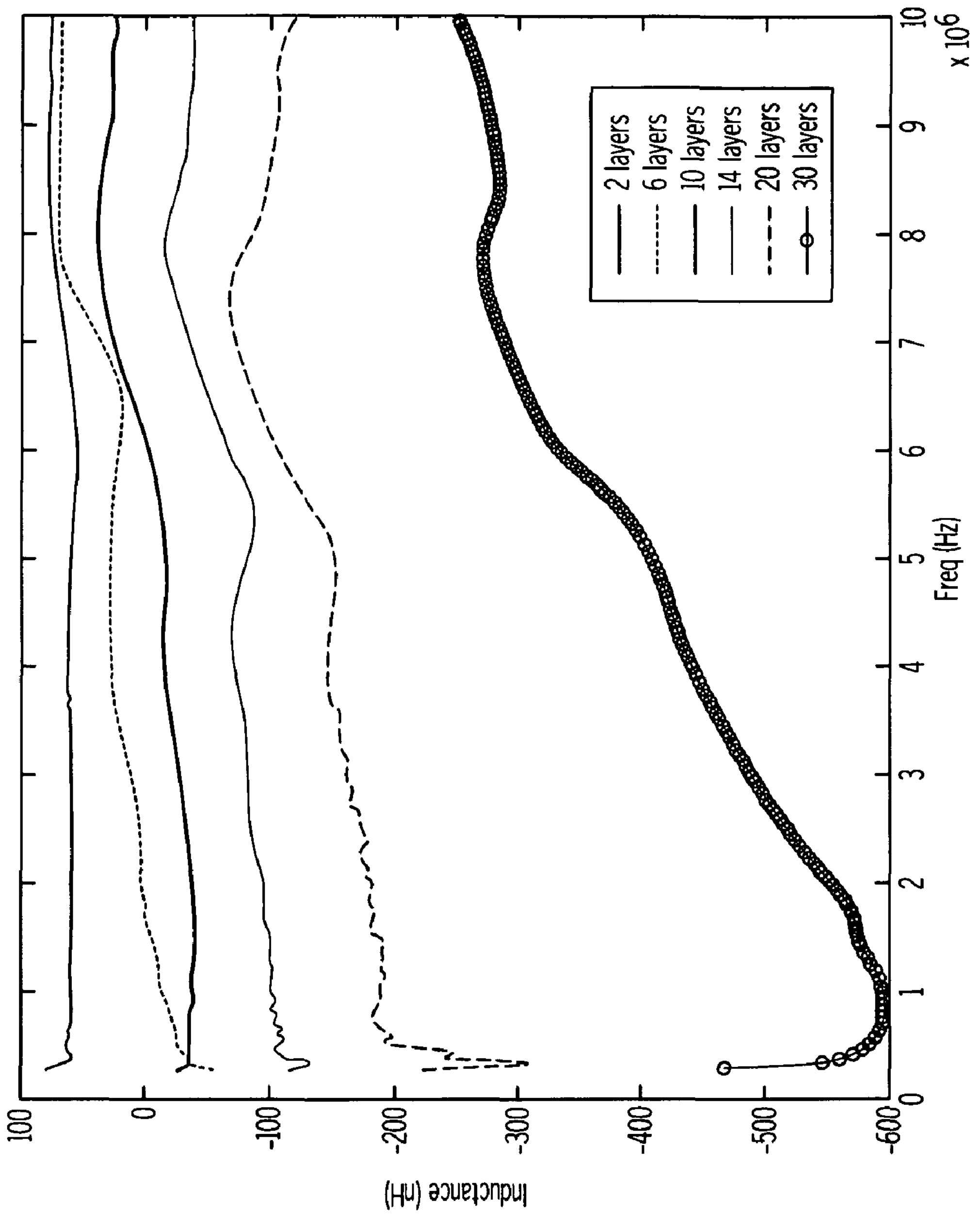
FIG. 7 is a graph depicting the extent of negative self-inductance exhibited at frequencies up to 10 MHz by 10-turn circle spiral inductors as a function of number of multilayers. In the inductors, each multilayer consisted essentially of a first layer of aluminum and a second layer of copper. In each multilayer the ratio of the thickness of the first layer to the thickness of the second layer was about 2.0. The total thickness of each vertical stack was about 1 μm, and the thickness of each first layer was substantially the same in all multilayers.

To examine the negative inductance behavior for a given multilayer composition and thickness ratio with respect to number of multilayers, six inductors were fabricated according to embodiments of the present invention. The inductors comprised 2 to 30 $Al_{66}Cu_{34}$ multilayers, according to the notation described in Example 1 above. The total thickness of each planar conductor was about 1.0 μm. Thus, the thickness of each multilayer varied with respect to number of multilayers, but the thickness ratio of the aluminum layers to the copper layers in each multilayer was constant. The inductance of these inductors with respect to frequency was calculated using the conversion from S-parameters, as described above. The results are compiled in FIG. 7.

As the data clearly indicate, negative inductance behavior increases in inductors according to embodiments of the invention at all frequencies below 10 MHz as the number of multilayers increases, with total thickness being held constant. When approximately 14 multilayers are formed, inductance is negative at all frequencies below 10 MHz. The negative inductance characteristics increase quite dramatically for the 1.0-μm thick inductors as the number of $Al_{66}Cu_{34}$ multilayers is increased from 20 to 30.

Example 4

Figure 8:
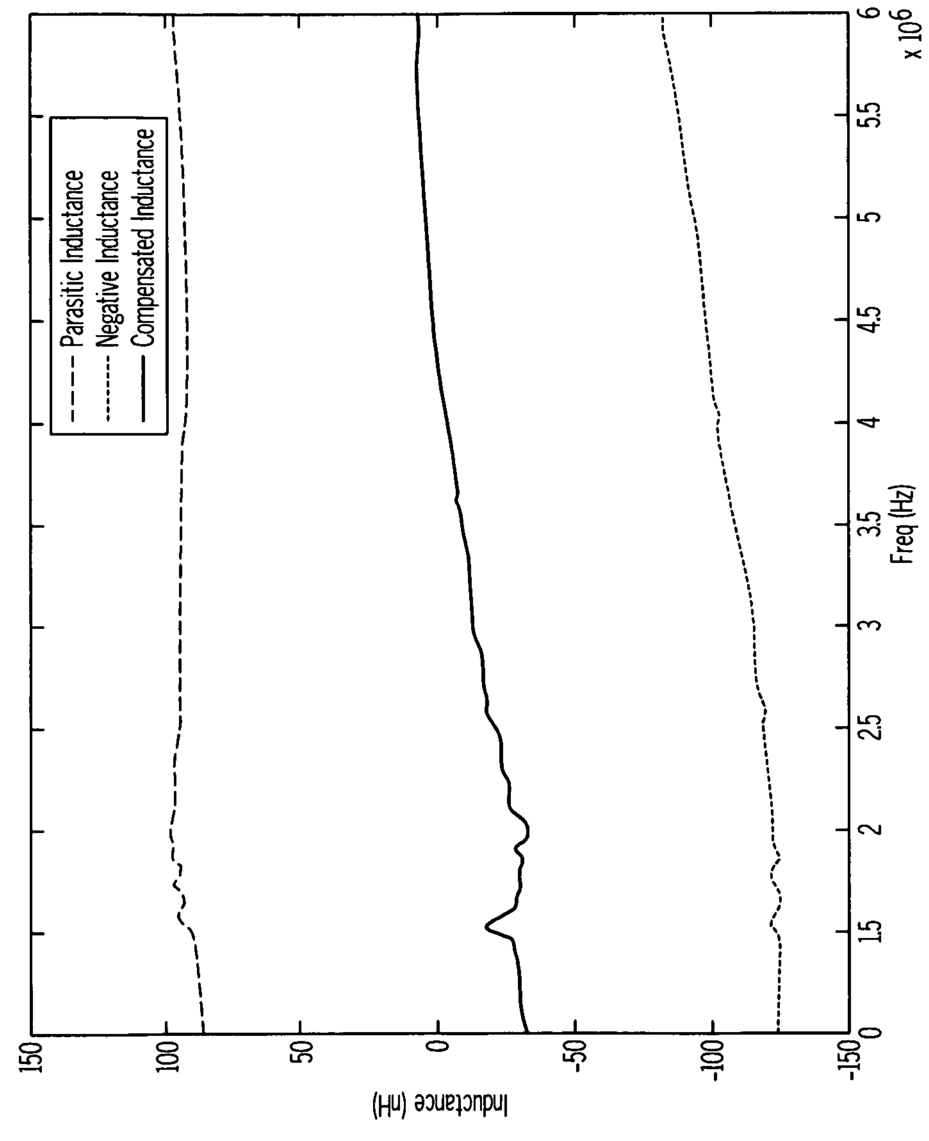
FIG. 8 is a graph illustrating the compensated inductance resulting from connecting a negative inductor according to embodiments of the present invention in series with a positive inductor.

A test was performed to verify the negative inductance functionality in an actual circuit to demonstrate a condition where unwanted parasitic inductance is compensated by negative inductance. To set up the test, an inductor with positive inductance was fabricated. Through a simple wire bond, this inductor was connected in series with an inductor having negative inductance and fabricated according to embodiments of the present invention. The test results are shown in the graph of FIG. 8. The test results confirm that the negative inductance of the inductor according to embodiments of the present invention compensates the parasitic inductance of the positive inductor wired in series with the inventive inductor, whereby $L_{total}=L_{parasitic}+L_{negative}$.

What is claimed is:

1. An inductor comprising a substrate and a planar conductor structure on a surface of the substrate, the planar conductor structure having a total thickness of from 0.1 μm to 5 μm and comprising a vertical stack of at least fourteen multilayer films, each multilayer film comprising a first layer consisting essentially of aluminum, the first layer defining a first vertical thickness; and a second layer consisting essentially of copper, the second layer covering the first layer and defining a second vertical thickness, such that the first vertical thickness is substantially the same in all multilayer films of the vertical stack and such that the ratio of the first vertical thickness to the second vertical thickness is about 2 in all multilayer films of the vertical stack, the vertical stack being formed by a repetitive series of alternating depositions of first layers of aluminum and second layers of copper onto the substrate;

a first contact point; and a second contact point, the inductor exhibiting a negative electrical self-inductance when an electric signal of alternating current having a frequency of up to 10 MHz is transmitted from the first contact point to the second contact point.

2. The inductor of claim 1, wherein the planar conductor structure is a series of successive spirals defining a number of turns, a track width, a spacing, an inner radius, and a shape, the shape being selected from the group consisting of a triangle, a square, a rectangle, a higher-order polygon, an ellipse, and a circle.

3. The inductor of claim 2, wherein the number of turns is 1 to 20, the track width is 0.1 μm to 200 μm, the spacing is 0.1 μm to 200 μm, and the inner radius is 0.2 μm to 400 μm.

4. The inductor of claim 3, wherein the planar conductor structure comprises at least thirty multilayer films.

5. A microelectronic device comprising at least one negative inductor and at least one positive inductor having a positive parasitic inductance and wired in series with the at least one negative inductor, the at least one negative inductor compensating the positive parasitic inductance of the at least one positive inductor, the at least one negative inductor being an inductor according to claim 1.

* * * * *